United States Patent
Ohwada (10) Patent No.: US 8,023,607 B2
(45) Date of Patent: Sep. 20, 2011

(54) FREQUENCY SYNCHRONIZATION METHOD AND APPARATUS

(75) Inventor: Hideo Ohwada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 792 days.

(21) Appl. No.: 12/007,841

(22) Filed: Jan. 16, 2008

(65) Prior Publication Data

US 2008/0181345 A1    Jul. 31, 2008

(30) Foreign Application Priority Data

Jan. 25, 2007  (JP) ................................ 2007-015511

(51) Int. Cl.
*H03D 3/24*   (2006.01)
(52) U.S. Cl. ...................................... 375/375; 375/377
(58) Field of Classification Search .................. 375/339, 375/344, 345, 354, 355, 375
See application file for complete search history.

(56) References Cited

U.S. PATENT DOCUMENTS

| 5,612,975 A | * | 3/1997 | Becker et al. ................. 375/319 |
| 5,671,253 A | * | 9/1997 | Stewart ......................... 375/316 |
| 5,768,323 A | * | 6/1998 | Kroeger et al. ............... 375/355 |
| 2006/0181797 A1 | * | 8/2006 | Sugawara et al. .............. 360/51 |

FOREIGN PATENT DOCUMENTS

JP    2002-027005    1/2002

* cited by examiner

*Primary Examiner* — Emmanuel Bayard
(74) *Attorney, Agent, or Firm* — Murphy & King, P.C.

(57) ABSTRACT

A frequency synchronization method comprise a first step of detecting a frequency error which occurs when a high-frequency receiving signal is converted into a digital signal of a base-band, performing rounding or discarding processing and generating a local oscillation signal depending on the converted analog signals, a second step of generating a digital signal whose frequency depending on a discard component obtained by the rounding or discarding processing when the rounding or discarding processing is performed, and a third step of canceling a frequency component of the digital signal which is generated by the second step from a frequency component of the digital signal of the base-band.

8 Claims, 7 Drawing Sheets

FREQUENCY SYNCHRONIZATION METHOD AND APPARATUS

CROSS-REFERENCE TO RELATED APPLICATIONS

This application is based upon and claims the benefit of priority from the prior Japanese Patent Application No. 2007-15511, filed on Jan. 25, 2007, the entire contents of which are incorporated herein by reference.

BACKGROUND

The present method and apparatus relate to a frequency synchronization method and a frequency synchronization apparatus in a radio communication system.

DESCRIPTION OF THE RELATED ART

Frequency synchronization is very important in a radio communication system such as Wimax (World interoperability for microwave access). The previous technology of the apparatus which performs frequency synchronization is described in FIG. 5.

Figure 5:
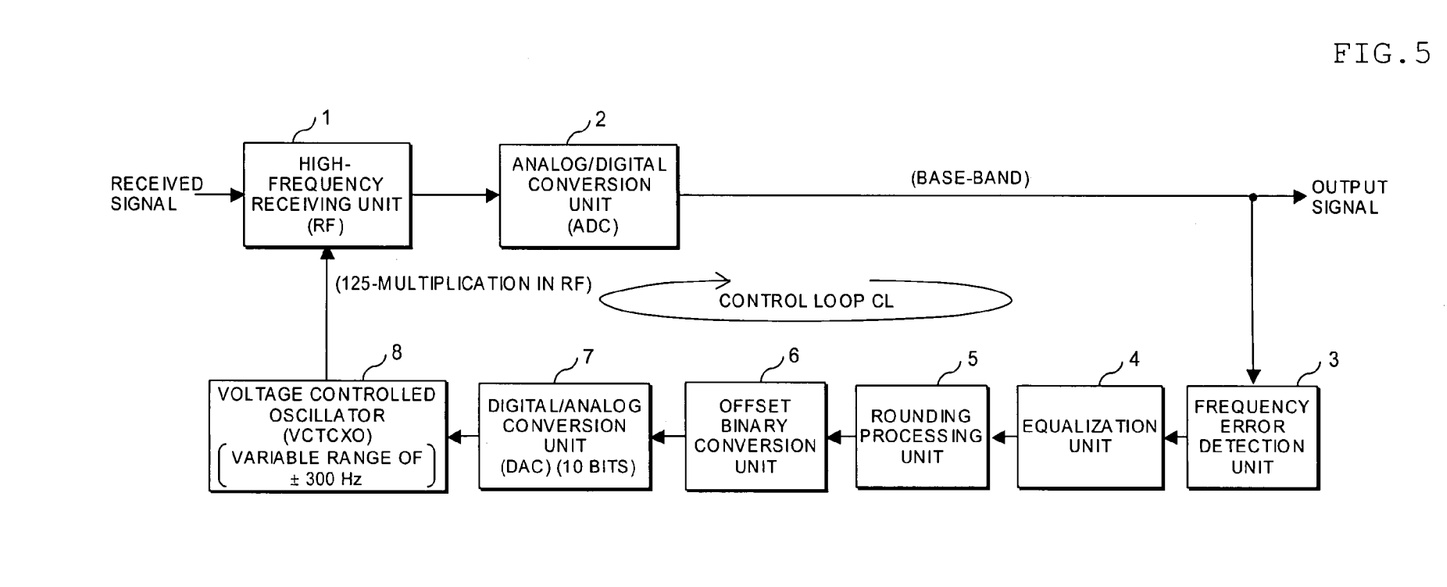
FIG. 5 shows a block diagram showing a frequency synchronization method and a frequency synchronization apparatus in the previous example.

That is, in the previous example, a control loop (CL) comprises a high-frequency receiving unit (RF) 1, an analog/digital conversion unit (ADC) 2, a frequency error detection unit 3, an equalization unit 4, a rounding processing unit 5, an offset binary conversion unit 6, a digital/analog conversion unit (DAC) 7 and a voltage controlled oscillator (VCTCXO) 8. The previous example performs frequency synchronization by detecting a frequency error which occurs in the high-frequency receiving unit 1.

Figure 6:
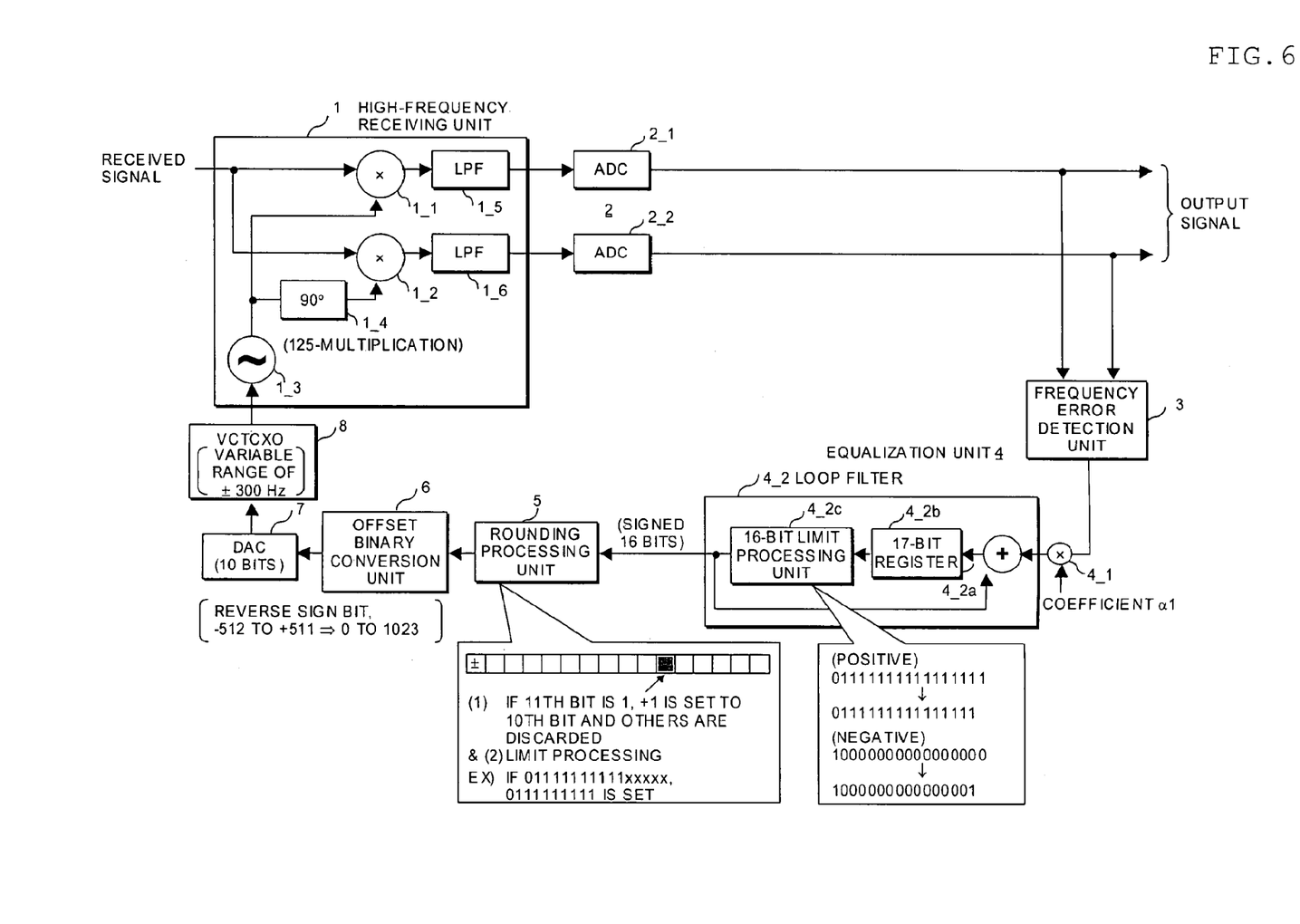
FIG. 6 shows a block diagram specifically showing the previous example shown in FIG. 5.

Operation of the previous example shown in FIG. 5 is explained as follows in reference to FIG. 6 and FIG. 7.

First, the high-frequency receiving unit 1 converts a received signal (frequency fR) into a base-band signal by using a local oscillation signal (frequency fL) which is generated in a voltage controlled oscillator 8. As shown in FIG. 6, the high-frequency receiving unit 1 comprises a multipliers 1_1 and 1_2 which input an I signal component (in-phase component) and a Q signal component (quadrature phase component) respectively, a multiplier 1_3 in which a local oscillator signal from the voltage controlled oscillator 8 is multiplied by 125, a phase shifter 1_4 which shifts a phase of an output signal of the frequency multiplier 1_3 90 degrees, and a low-pass filters (LPF) 1_5 and 1_6 which pass only a low-frequency component from each output signal of the multipliers 1_1 and 1_2. The multiplier 1_1 multiplies a received signal and an output signal of the multiplier 1_3, and outputs the I signal component. The multiplier 1_2 multiplies the received signal and an output signal of the multiplier 1_3 and the phase shifter 1_4, and outputs the Q signal component.

Therefore, the low-pass filters 1_5 and 1_6 in the high-frequency receiving unit 1 output a base-band signal of the I signal component and a base-band signal of the Q signal component respectively. Analog/digital conversion units 2_1 and 2_2 convert the base-band signals from the low-pass filters 1_5 and 1_6 into digital signals and output the digital signals as demodulated signals.

Figure 7:
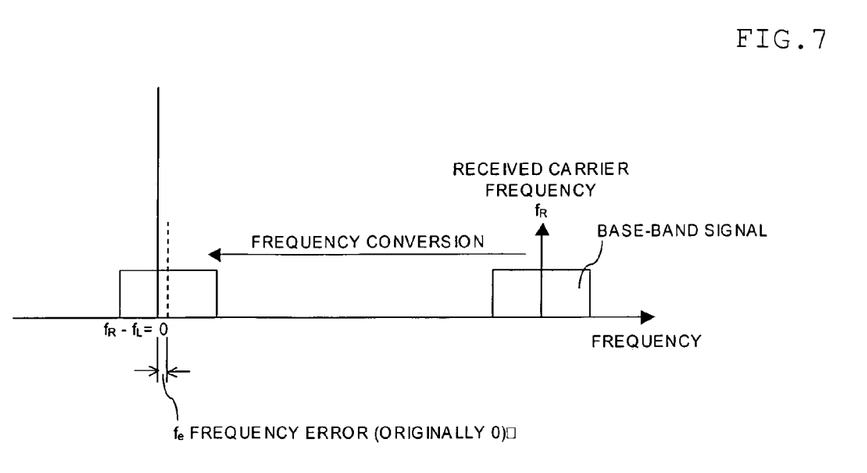
FIG. 7 shows a diagram illustrating a frequency error which is generated in a high-frequency receiving unit.

The base-band signal has a vestigial frequency error (fe=fR−fL) (sampling error) as shown in FIG. 7. Accordingly, the previous example needs to detect and correct the error component.

The error component is detected in the frequency error detection unit 3. In case of the OFDM method, for example, the frequency error detection unit 3 detects a frequency error by using correlated information which is obtained by a guard interval signal.

The frequency error detected in the frequency error detection unit 3 is transmitted as a signed value to the equalization unit 4. As shown in FIG. 6, the equalization unit 4 comprises a multiplier 4_1 and a loop filter 4_2. The loop filter 4_2 comprises a series circuit consisting of an adder 4_2a, a register 4_2b and a limit processing unit 4_2c. The adder 4_2a adds an output value of the limit processing unit 4_2c to an output value of the multiplier 4_1.

That is, the multiplier 4_1 firstly multiplies a coefficients, which is used to adjust sensitivity, by the frequency error which is outputted from the frequency error detection unit 3. Then, the output from the loop filter 4_2 is averaged to be a 17-bit digital signal. Note that the loop filter 4_2 has a 16-bit limit processing unit 4_2c. As shown in figure, the limit processing unit 4_2c performs limit processing as that a 17th bit is discarded when the sign bit of the 17-bit digital signal from the register 4_2b is 0 (positive) and a 17th bit is discarded and a 16th bit is given "1" when the sign bit is 1 (negative).

The rounding processing unit 5 performs rounding processing as that (1) a 10th bit of a 16-bit data with a sign bit is given "1" when a 11th bit of the 16-bit data with a sign bit is "1" and the bits which are lower than the 10th bit are discarded. The rounding processing unit 5 performs rounding processing as that (2) in case of "01111111111xxxxx", for example, the lower five bits are discarded resulting in a 10-bit "0111111111". Digital signals rounded by the rounding processing unit 5 become the signed values "−512 to +511". The offset binary conversion unit 6 performs conversion processing as that the most significant bit is flipped, which is converted into a straight binary, and which is transmitted as the data of 10-bit "0 to 1023" to the digital/analog conversion unit 7.

The voltage controlled oscillator 8 transmits a local oscillator signal corresponding to an analog output voltage from the digital/analog conversion unit 7 to the high-frequency receiving unit 1.

Japanese Laid-Open Patent Publication No. 2002-27005 discloses a demodulator having an A/D conversion in which a demodulated analog signal is synchronized with a sampling clock by which it is to be sampled, thereby being converted into a digital signal, and an unbounded phase shift means to obtain demodulated signals by giving phase shift revolution control to the two of the mutually orthogonal digital signals which are output by the A/D conversion means.

Thus, in the above-described previous example, a frequency can be adjusted to a frequency error according to resolution of the digital/analog conversion unit 7 by putting back the frequency error as an analog signal to the voltage controlled oscillator 8 to reduce the frequency error as much as possible. In the above-described previous example, the resolution (the number of bits) of the digital/analog conversion unit 7 needs to be increased to further reduce frequency error. However, in the previous example, the resolution of the digital/analog conversion unit 7 generally has to be increased by using a high-technology with technical difficulties, such as clock jitter.

In the above-described previous example, if the resolution of the digital/analog conversion unit 7 is not increased, a variable range of the voltage controlled oscillator 8 can be reduced. However, there is a problem that the frequency range processed in the high-frequency receiving unit 1 becomes narrow.

SUMMARY

It is an object of the present method and apparatus to provide a frequency synchronization method and apparatus which increases the resolution of the digital/analog conversion unit and the frequency band that can be handled by the high-frequency receiving unit.

The frequency synchronization method comprises a first step of detecting a frequency error which occurs when a high-frequency receiving signal is converted into a digital signal of a base-band, performing rounding or discarding processing and generating a local oscillation signal depending on the converted analog signals, a second step of generating a digital signal whose frequency depends on a discard component obtained by the rounding or discarding processing when the rounding or discarding processing is performed and a third step of canceling a frequency component of the digital signal which is generated by the second step from a frequency component of the digital signal of the base-band.

The frequency synchronization method further comprises a fourth step of giving a value which is equivalent to a frequency offset to the discard component, a fifth step of generating a digital signal corresponding to a value which is obtained by the fourth step, a sixth step of canceling the frequency component of the digital signal which is obtained by the fifth step from the frequency component of the digital signal of the base-band, and a seventh step of converting the digital signal obtained by the fifth step into an analog signal and generating a transmission signal from the analog signal and the local oscillation signal.

The second step includes a step of equalizing the discard component and a step of generating a digital signal whose frequency corresponds to the averaged discard component.

The third step includes a step of performing the cancellation by inputting an I signal component and a Q signal component of each digital signal to be complex multiplied.

The frequency synchronization apparatus comprises a first means for performing rounding or discarding processing for a frequency error occurring when a high-frequency receiving signal is converted into a digital signal of the base-band by a local oscillation signal and converting the frequency error from the rounding or discarding processing into an analog signal and generating the local oscillation signal corresponding to the analog signal, a second means for generating a digital signal whose frequency corresponds to a discard component of the rounding or discarding processing;

a third means for canceling a frequency component of the digital signal generated by the second means from a frequency component of the base-band.

The frequency synchronization apparatus further comprises a fourth means for adding a value which is equivalent to a frequency offset, a fifth means for generating a digital signal whose frequency corresponds to a value obtained by the fourth means, a sixth means for canceling a frequency component of the digital signal obtained by the fifth means from a frequency component of an input signal, and a seventh means for converting the digital signal obtained by the fifth means into an analog signal and generating a transmission signal from the analog and the local oscillation signal.

The second means includes a means for equalizing the discard component and a means for generating a digital signal whose frequency corresponds to the averaged discard component.

The third means includes a means for performing the cancellation by inputting the I signal component and the Q signal component of each digital signal to be complex multiplied.

DETAILED DESCRIPTION OF THE EMBODIMENTS

Figure 1:
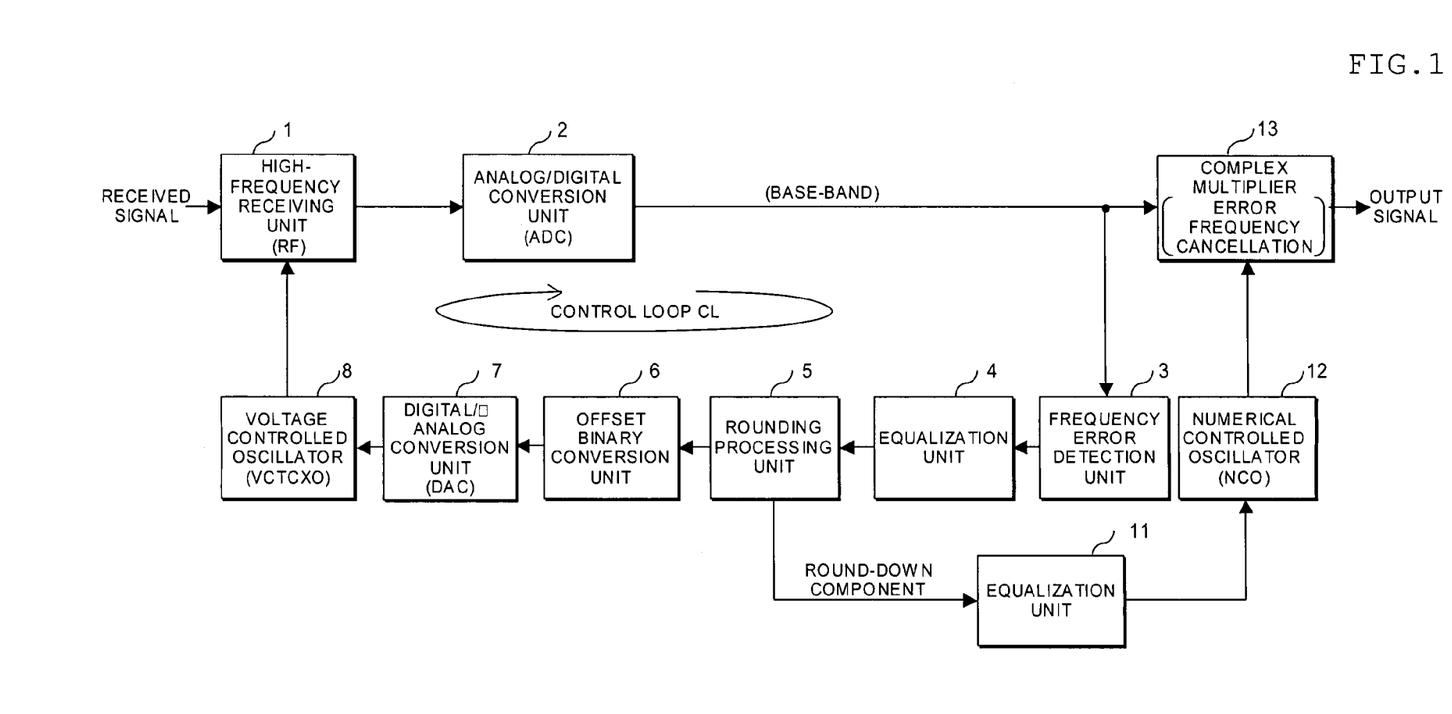
FIG. 1 shows a block diagram schematically showing a first embodiment of a frequency synchronization method and a frequency synchronization apparatus which relate to the present method and apparatus.

FIG. 1 schematically shows a first embodiment of a frequency synchronization apparatus which realizes a frequency synchronization method that relates to the present method and apparatus. Contrary to the previous example shown in FIG. 5, the present method and apparatus described in FIG. 1 additionally include an equalization unit 11 which inputs a discard component to be averaged, a numerical controlled oscillator 12 (NCO: Numerical Controlled Oscillator) which generates a frequency signal corresponding to an output of the equalization unit 11, and a complex multiplier 13 which inputs an output signal from the numerical controlled oscillator 12 and an output signal from the analog/digital conversion unit 2 and generates an output signal whose frequency component corresponding to a frequency error is discarded from a base-band signal.

Figure 2:
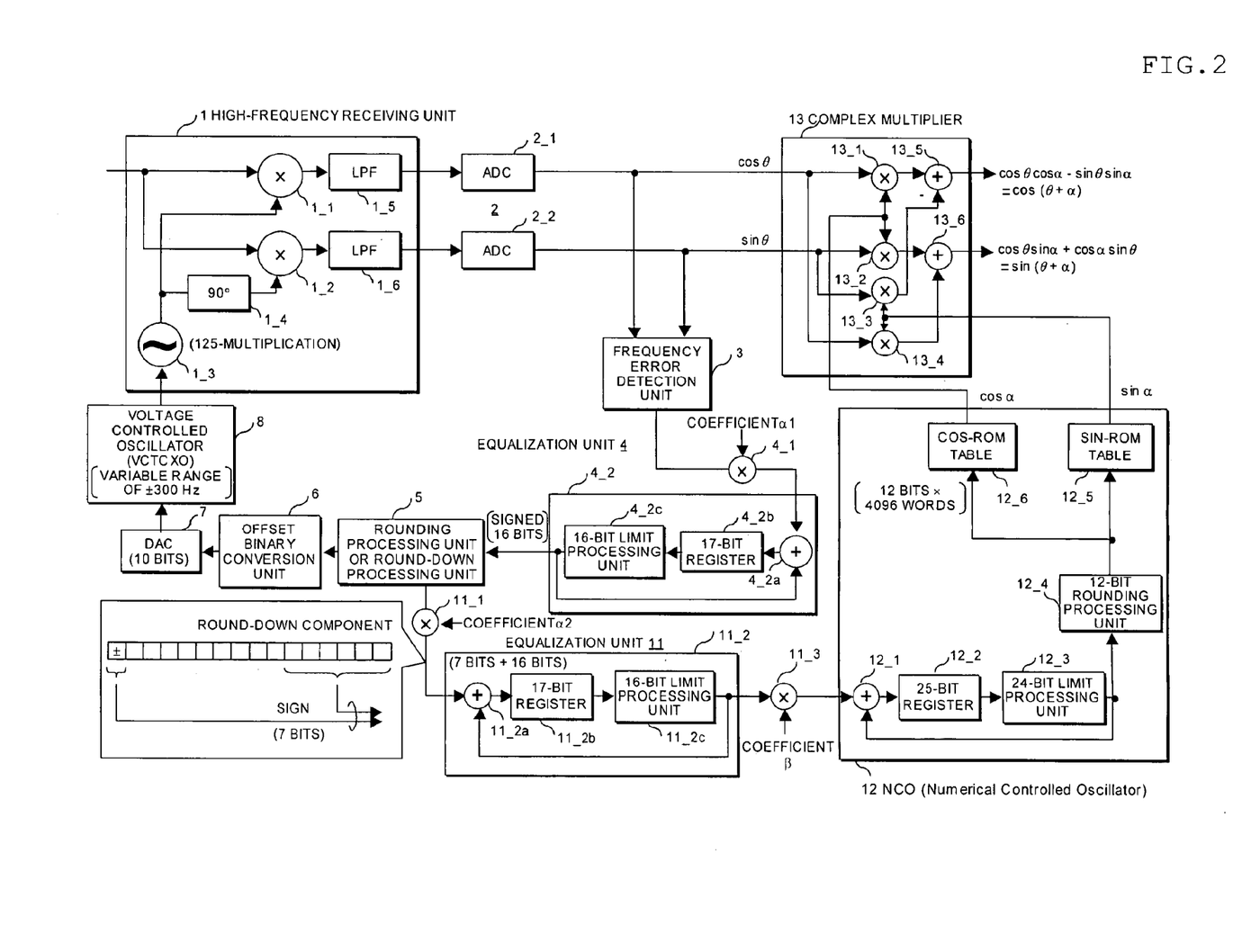
FIG. 2 shows a block diagram specifically showing a first embodiment of a frequency synchronization method and a frequency synchronization apparatus shown in FIG. 1.
Figure 3:
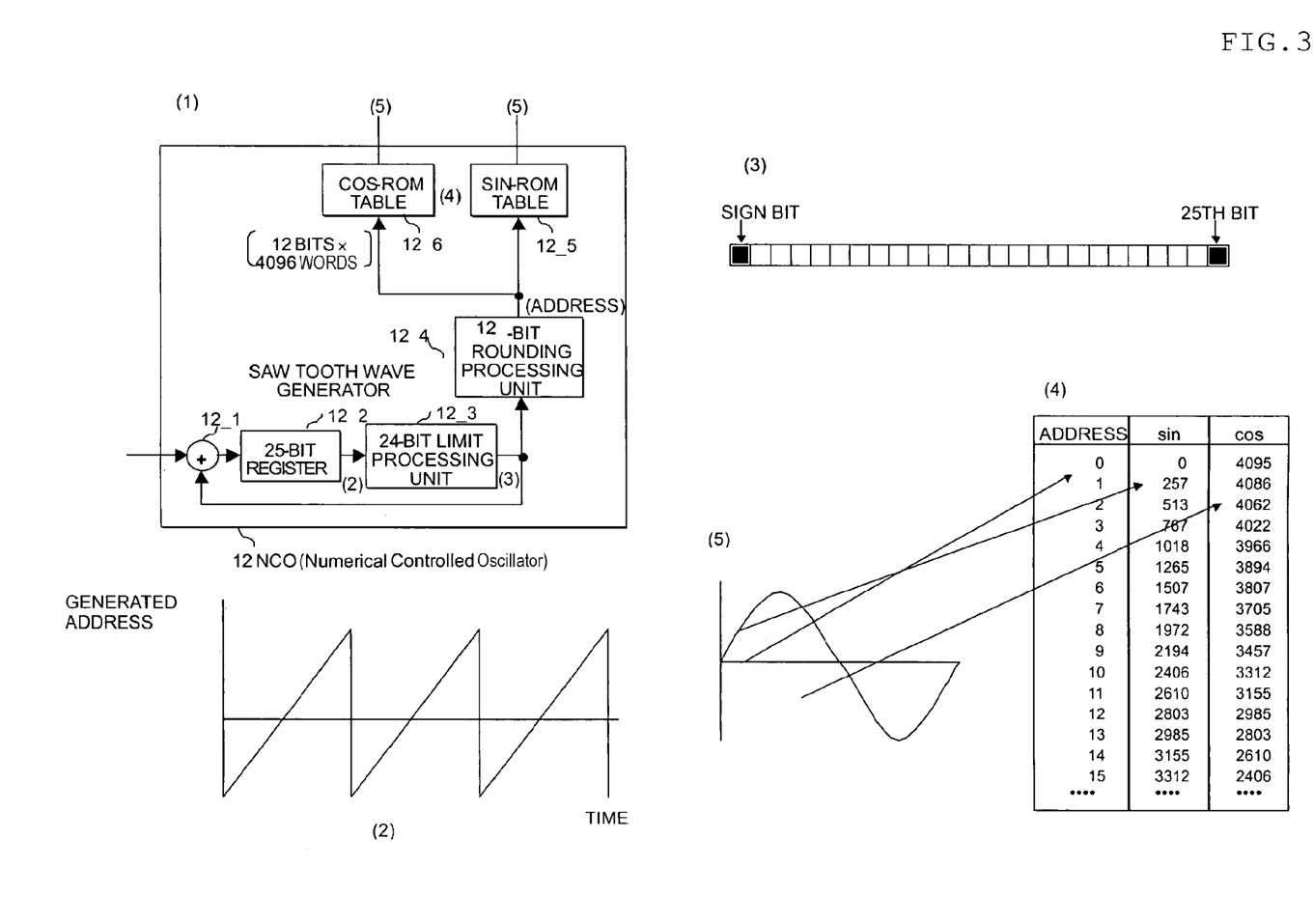
FIG. 3 shows a diagram illustrating operation of a numerical controlled oscillator (NCO) 12 shown in FIGS. 1 and 2.

An operation of the first embodiment shown in FIG. 1 is explained as follows in reference to FIG. 2 and FIG. 3 showing specific examples.

First of all, a control loop (CL) is similar to that in the previous example shown in FIG. 5. When the rounding processing unit 5 performs rounding processing (16 bits→10 bits), the present method and apparatus shown in FIG. 6 cancel a frequency error of a base-band output signal by an output signal which is generated by feed-forward control, focusing on the fact that bits below the 11th bit are discarded.

Consequently, the rounding processing unit 5 transmits a discard component (6-bit) with a sign (1-bit) to an equalization unit 11. An equalization unit 4 comprises a multiplier 11_1 multiplying a coefficient α2 which is used to adjust sensitivity, a loop filter 11_2, and a multiplier 11_3 multiplying a coefficient β which is used to adjust sensitivity. The loop filter 11_2 comprises a series circuit consisting of an adder 11_2a, a register 11_2b and a limit processing unit 11_2c. The multiplier 11_3 of the equalization unit 11 corresponds to the multiplier 4_1 of the equalization unit 4 in FIG. 6. The loop filter 11_2 corresponds to an adder 4_2a, a register 4_2b and a limit processing unit 4_2c of the loop filter 4_2, in FIG. 6. The operation of the equalization unit 11 is the same as that of the equalization unit 4.

In this way, the discard component which is averaged in the equalization unit 11 corresponds to a frequency (voltage) of the error component which is generated in the digital/analog conversion unit 7 in the control loop (CL). The numerically controlled oscillator 12 oscillates at the frequency of the averaged error component.

That is, as described in FIG. 2 and FIG. 3 (1), the numerical controlled oscillator 12 comprises an adder 12_1, a 25-bit register 12_2, a 24-bit limit processing unit 12_3, a series circuit consisting of a 12-bit rounding processing unit 12_4, a sin-ROM table 12_5 and a cos-ROM table 12_6 which consist of 12-bit×4069-words respectively and are connected to the rounding processing unit 12_4. The adder 12_1 adds an output value of the limit processing unit 12_3 to an output value of the multiplier 11_3 of the equalization unit 11.

As shown in FIG. 3 (2), a register 12_2 generates a saw tooth from a hold value that is circulated and integrated. Then, a slope of the saw tooth, and a frequency of the saw tooth, varies according to output values from the multiplier 11_3. For example, if an output value from the multiplier 11_3 becomes larger, the slope of the saw tooth becomes larger. As a result, the frequency of the saw tooth becomes higher.

In this way, the saw tooth generated by the register 12_2 is sent to the limit processing unit 12_3. The limit processing unit 12_3 as described in FIG. 3 (3) adds "1" to the 25th bit when a sign bit is 0 (positive) and no addition is done when all bits except the sign bit are "1". Then, the limit processing unit 12_3 uses the high-order 24 bits and discards the lower-order 1 bit.

The limit processing unit 12_3 also adds "1" to the 25th bit of the saw tooth when the sign bit is 1 (negative), and then uses the high-order 24 bits and discards the lower-order 1 bit.

Thereafter, the rounding processing unit 12_4 rounds a 24-bit saw tooth signal to 12-bit length and transmits an address according to the 12-bit signals to the table 12_5 and the table 12_6.

Exemplary contents of the tables at this point are shown in FIG. 3 (4). That is, the numerical controlled oscillator 12 generates a sin signal and a cos signal which correspond to the frequency of the saw tooth as described in FIG. 3 (5) by using the output of the saw tooth from the rounding processing unit 12_4 as an address of the ROM tables 12_5 and 12_6. The sin signal and the cos signal are transmitted to the complex multiplier 13.

The complex multiplier 13 may be one which is known. For example, as shown in FIG. 2, the complex multiplier 13 comprises four multipliers 13_1 to 13_4 and two adders 13_5 to 13_6.

Here, in case that the output value of the sin-ROM table 12-5 is $\sin \alpha$ and that of the cos-ROM table 12-6 is $\cos \alpha$, the output of the numerical controlled oscillator 12 can be expressed as $\cos \alpha + j \sin \alpha$. In the case that an input signal to be input to the complex multiplier 13 is $\cos \theta + j \sin \theta$ as shown in the FIG. 2, the complex multiplier 13 has the following multiplication result:

$$(\cos \theta + j \sin \theta)(\cos \alpha + j \sin \alpha)$$

$$= \cos \theta \cos \alpha + j \cos \theta \sin \alpha = j \sin \theta \cos \alpha - \sin \theta \sin \alpha$$

$$= \cos \theta \cos \alpha - \sin \theta \sin \alpha + j(\cos \theta \sin \alpha + \cos \alpha \sin \theta) \quad \text{Formula (1)}$$

Accordingly, an output signal from the complex multiplier 13 becomes such that an I signal component is $\cos \theta \cos \alpha - \sin \theta \sin \alpha = \cos(\theta+\alpha)$ and a Q signal component is $\cos \theta \sin \alpha + \cos \alpha \sin \theta = \sin(\delta+\alpha)$ as shown in FIG. 2.

Here, $\theta = (x-\alpha)$ is represented with that a shows a frequency error and x shows a true frequency.

Therefore, when $\theta = (x-\alpha)$ is substituted,
$\cos(x-\alpha+\alpha) = \cos(x)$ and
$\sin(x-\alpha+\alpha) = \sin(x)$ are represented, showing that the frequency error is canceled.

The ROM tables 12_5 and 12_6 store information for one cycle (or ½-cycle or ¼-cycle as applicable with circuit ingenuity) of sin and cos, respectively. And, the oscillation frequency may be varied depending on input values to be input to the numerical controlled oscillator 12.

In the previous example, a value which is given to the digital/analog conversion unit 7 is rounded (round-off) from an output of the equalization unit 4. But, in case of the present method and apparatus, some processing may be eliminated to simplify the circuit. A frequency error occurring in the digital/analog conversion unit 7 can be canceled by a digital unit.

Figure 4:
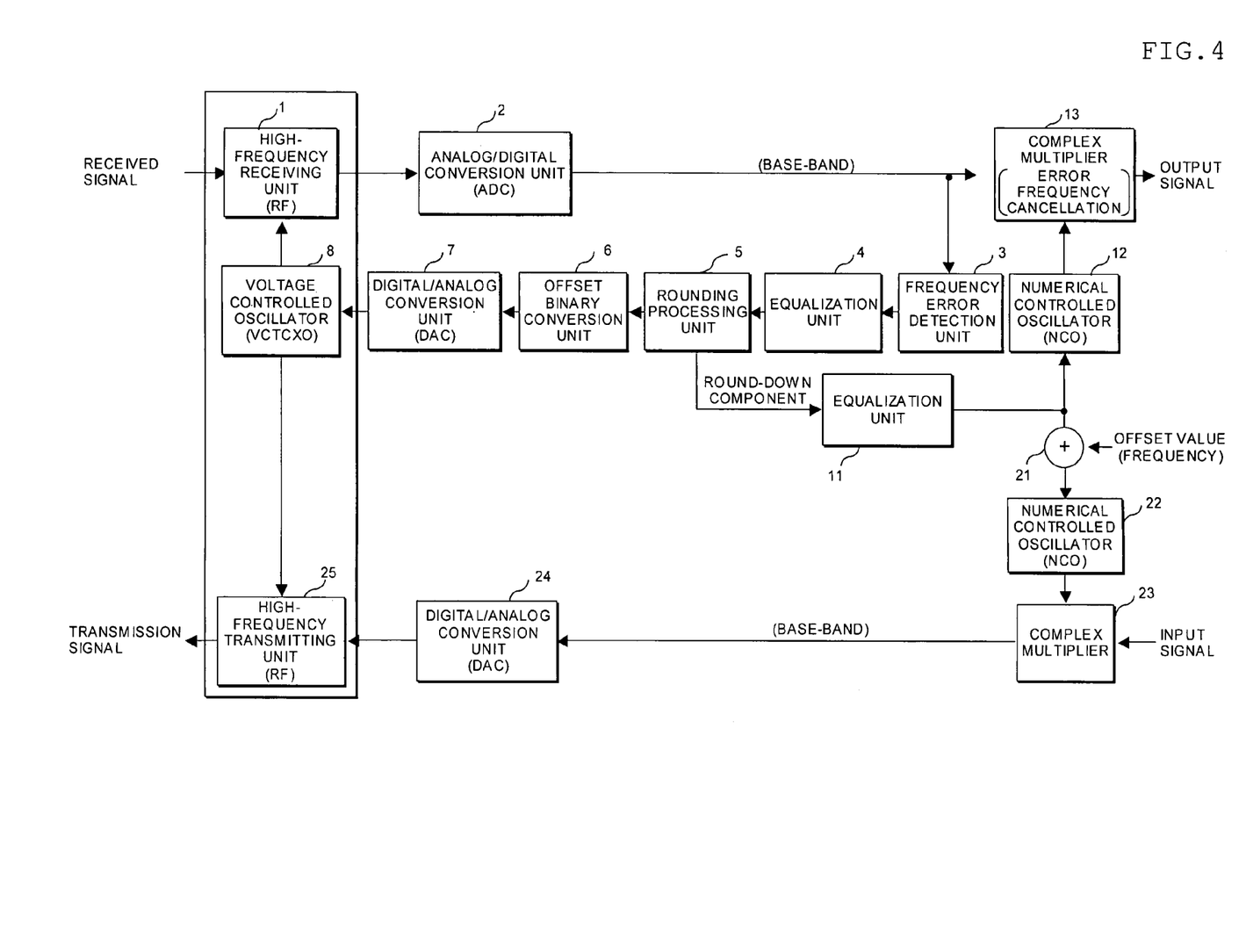
FIG. 4 shows a block diagram showing an embodiment [2] of a frequency synchronization method and a frequency synchronization apparatus which relate to the present method and apparatus.

FIG. 4 shows an embodiment in which the first embodiment shown in FIG. 1 to FIG. 3 may also include a transmission circuit.

That is, the second embodiment has the adder 21 which adds an offset value corresponding to a frequency difference between frequencies of a reception system and a transmission system to an output signal of the equalization unit 11 which is arranged in a reception system. The second embodiment further has the numerical controlled oscillator 22 and the complex multiplier 23 which are arranged in the same way as the combination of the numerical controlled oscillator 12 and the complex multiplier 13. In the second embodiment, the input signal of the base-band signal is set to accurate frequency in a frequency offset state as well as in the transmission system, The digital/analog conversion unit 24 converts the input signal into an analog signal. A high-frequency transmitting unit 25 synthesizes the analog signal in a local oscillation signal from the voltage controlled oscillator 8 used in the reception system and generates a transmission signal.

In the second embodiment, the reception system and the transmission system can be controlled independently by setting up values of the numerical controlled oscillators separately.

The present method and apparatus are not limited to the above embodiments. It is apparent to those skilled in the art that various modifications can be made based on the appended claims.

What is claimed is:

1. A frequency synchronization method comprising:
   performing by a frequency synchronization apparatus processes of:
   detecting a frequency error which occurs when a high-frequency receiving signal is converted into a digital signal of a base-band, performing rounding or discarding processing and generating a local oscillation signal depending on the converted digital signals;
   generating a digital signal whose frequency depending on a discard component obtained by the rounding or discarding processing when the rounding or discarding processing is performed;
   canceling a frequency component of the digital signal which is generated by the generating from a frequency component of the digital signal of the base-band.

2. A frequency synchronization method according to claim 1, comprising;
   giving a value which is equivalent to a frequency offset to the discard component;
   generating a digital signal corresponding to a value which is obtained by the giving;

canceling the frequency component of the digital signal which is obtained by generating the digital signal corresponding to a value from the frequency component of the digital signal of the base-band; and converting the digital signal obtained by generating the digital signal corresponding to a value into an analog signal and generating a transmission signal from the analog signal and the local oscillation signal.

3. A frequency synchronization method according to claim 1, wherein the generating includes equalizing the discard component and generating a digital signal whose frequency corresponds to an averaged discard component.

4. A frequency synchronization method according to claim 1, wherein the canceling includes performing the cancellation by inputting an I signal component and a Q signal component of each digital signal to be complex multiplied.

5. A frequency synchronization apparatus comprising:
   a first circuit to perform rounding or discarding processing for a frequency error occurred when a high-frequency receiving signal is converted into the digital signal of a base-band by a local oscillation signal and converts the frequency error which is rounded or discarded processing into an analog signal and generates the local oscillation signal corresponding to the analog signal;
   a second circuit to generate a digital signal whose frequency corresponds to a discard component of the rounding or discarding processing;
   a third circuit to cancel a frequency component of the digital signal generated by the second circuit from a frequency component of the base-band.

6. A frequency synchronization apparatus according to claim 5, comprising:
   a fourth circuit to add a value which is equivalent to a frequency offset;
   a fifth circuit to generate a digital signal whose frequency corresponds to a value obtained by the fourth circuit;
   a sixth circuit to cancel a frequency component of the digital signal obtained by the fifth circuit from a frequency component of an input signal; and
   a seventh circuit to convert the digital signal obtained by the fifth circuit into an analog signal and generates a transmission signal from the analog and the local oscillation signal.

7. A frequency synchronization apparatus according to claim 5, wherein the second circuit includes a circuit to equalize the discard component and a circuit to generate a digital signal whose frequency corresponds to an averaged discard component.

8. A frequency synchronization apparatus according to claim 5, wherein
   the third circuit includes a circuit to perform the cancellation by inputting an I signal component and a Q signal component of each digital signal to be complex multiplied.

* * * * *